United States Patent
Masuda

(10) Patent No.: US 9,184,760 B2
(45) Date of Patent: Nov. 10, 2015

(54) SEMICONDUCTOR DEVICE

(71) Applicant: RENESAS ELECTRONICS CORPORATION, Kawasaki-shi, Kanagawa (JP)

(72) Inventor: Takaya Masuda, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/560,980

(22) Filed: Dec. 4, 2014

(65) Prior Publication Data

US 2015/0084796 A1 Mar. 26, 2015

Related U.S. Application Data

(63) Continuation of application No. 14/036,777, filed on Sep. 25, 2013, now Pat. No. 8,922,408.

(30) Foreign Application Priority Data

Sep. 26, 2012 (JP) ................. 2012-212794

(51) Int. Cl.
*H03M 1/12* (2006.01)
*H03M 1/06* (2006.01)

(52) U.S. Cl.
CPC .............. *H03M 1/1245* (2013.01); *H03M 1/06* (2013.01); *H03M 1/12* (2013.01)

(58) Field of Classification Search
CPC ... H03M 1/1245; H03M 1/0863; H03M 1/12; H03M 1/34
USPC ......................... 341/155, 158, 122
See application file for complete search history.

(56) References Cited

U.S. PATENT DOCUMENTS

| | | | |
|---|---|---|---|
| 7,830,286 B2 * | 11/2010 | Kabune et al. | 341/122 |
| 7,956,789 B2 | 6/2011 | Ushie | |
| 8,018,362 B2 | 9/2011 | Katsuki et al. | |
| 2006/0055578 A1 | 3/2006 | Sushihara et al. | |

(Continued)

FOREIGN PATENT DOCUMENTS

| | | |
|---|---|---|
| JP | 2001-244813 A | 9/2001 |
| JP | 2009-188736 A | 8/2009 |
| JP | 2010-268349 A | 11/2010 |
| JP | 2011-077847 A | 4/2011 |

OTHER PUBLICATIONS

Non-Final Office Action U.S. Appl. No. 14/036,777 dated Jun. 2, 2014.

(Continued)

*Primary Examiner* — Jean B Jeanglaude
(74) *Attorney, Agent, or Firm* — McDermott Will & Emery LLP

(57) ABSTRACT

A semiconductor device using analog-to digital (AD) conversion realizes reliable control so that, at the time of AD converting reference voltage, a low-voltage transistor in a reference voltage generating circuit is not destroyed by voltage held in a sample and hold circuit. In a semiconductor device, when an instruction of detecting a reference voltage value is received, a switch control unit controlling switching of an input signal of an internal AD converter temporarily automatically couples an input node of a sample and hold circuit and a ground node and, after that, couples the input node of the sample and hold circuit and an output node of a reference voltage generating circuit.

9 Claims, 9 Drawing Sheets

(56) References Cited

U.S. PATENT DOCUMENTS

2010/0289684 A1 11/2010 Ikeda
2011/0074612 A1 3/2011 Ariyoshi et al.
2012/0013497 A1 1/2012 Katsuki et al.

OTHER PUBLICATIONS

Notice of Allowance U.S. Appl. No. 14/036,777 dated Aug. 26, 2014.
Notification of Reasons for Refusal Japanese Patent Application No. 2012-212794 dated Aug. 25, 2015 with English translation.

* cited by examiner

SEMICONDUCTOR DEVICE

CROSS-REFERENCE TO RELATED APPLICATIONS

This Application is a Continuation Application of U.S. Ser. No. 14/036,777 filed Sep. 25, 2013, which claims priority to Japanese Patent Application No. 2012-212794 filed on Sep. 26, 2012. The subject matter of each is incorporated by reference herein in entirety.

BACKGROUND

The present invention relates to a semiconductor device having an AD (Analog-to-Digital) converter.

A semiconductor device (for example, a microcomputer) having therein an AD converter can detect, as digital values, an external input analog voltage, an internal reference voltage value output from a reference voltage generating circuit, an output value of an internal temperature sensor circuit, and the like. The AD converter is used, for example, by a method of monitoring chip environments by periodically AD converting the internal reference voltage value and the output value of the temperature sensor circuit while repeatedly AD converting the external input voltage.

There are also techniques that, in a semiconductor device having an AD converter, charges accumulated in a sample and hold capacitor are discharged and, after that, signal coupling is switched.

RELATED ART LITERATURE

Patent Literature

Patent Literature 1: Japanese Unexamined Patent Publication No. 2011-077847
Patent Literature 2: Japanese Unexamined Patent Publication No. 2001-244813

SUMMARY

With miniaturization and reduction in power consumption of a CMOS (Complementary Metal Oxide Semiconductor) logic circuit in recent years, the power supply voltage of the CMOS logic circuit decreases close to 1V. Consequently, reference voltage supplied to an internal power supply circuit is becoming lower than that in the conventional techniques.

In a circuit which is requested to operate at low voltage, a low-voltage transistor having a thin gate oxide film and a low threshold voltage is used. Although an entire reference voltage generating circuit may not be formed by low-voltage transistors, at least a low-voltage transistor having a low threshold voltage has to be used as an output transistor which is to be coupled to an internal power supply circuit.

At the time of AD converting an internal reference voltage, a voltage held in a sample and hold circuit is discharged in advance so that a high voltage is not applied to the low-voltage transistor. Concretely, the user rewrites the value of a register controlling discharge of the sample and hold circuit by a program. Therefore, when there is a programming error of the user, a problem occurs such that the low-voltage transistor in the reference voltage generating circuit is destroyed.

The other subjects and novel features will become apparent from the description of the specification and the appended drawings.

In a semiconductor device as an embodiment, when an instruction of detecting a reference voltage value is received, a switch control unit controlling switching of an input signal of an internal AD converter temporarily automatically couples an input node of a sample and hold circuit with a ground node and, after that, couples the input node of the sample and hold circuit with an output node of a reference voltage generating circuit.

In the embodiment, reliably control can be performed so that the low-voltage transistor in the reference voltage generating circuit is not destroyed by the voltage held in the sample and hold circuit.

DETAILED DESCRIPTION

Figure 1:
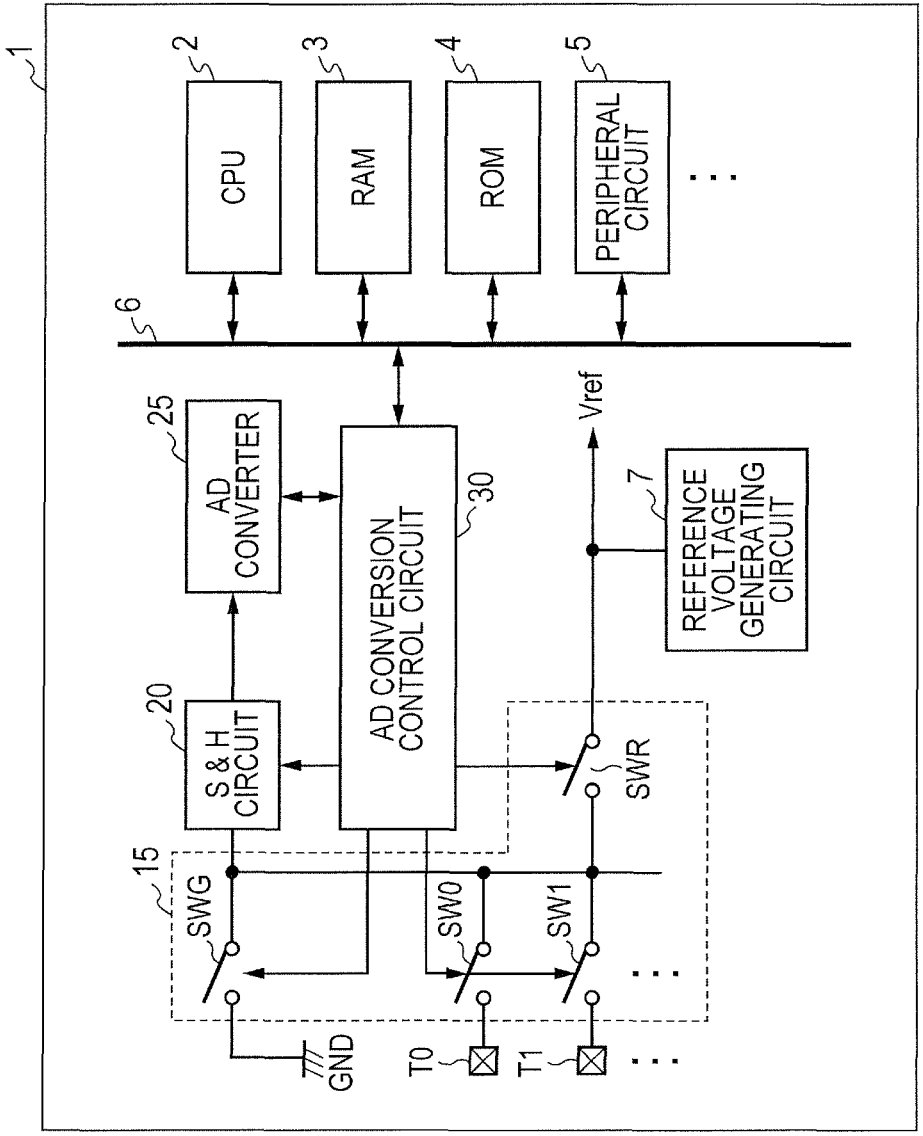
FIG. 1 is a block diagram illustrating an example of the configuration of a microcomputer chip as a first embodiment.

Hereinafter, embodiments will be described specifically with reference to the drawings. In the following, a microcomputer as an example of a semiconductor device having therein an AD converter will be described. In the following description, the same reference numerals are designated to the same or corresponding parts and their description will not be repeated.

First Embodiment

General Configuration of Microcomputer Chip

FIG. 1 is a block diagram illustrating an example of the configuration of a microcomputer chip as a first embodiment.

Referring to FIG. 1, a microcomputer chip 1 includes a CPU (Central Processing Unit) 2, a RAM (Random Access Memory) 3, a ROM (Read Only Memory) 4, and other peripheral circuits such as input/output circuits. The components are coupled to one another via a bus 6.

The CPU 2 controls the general operation of the microcomputer chip 1 by executing a program stored in the RAM 3 and the ROM 4. The RAM 3 and the ROM 4 are used as main storages of the CPU 2.

The microcomputer chip 1 further includes a sample and hold (S & H) circuit 20, an AD converter 25, an AD conversion control circuit 30, a switching unit 15, and a reference voltage generating circuit 7.

The AD converter 25 performs AD conversion of voltage held in the sample and hold circuit 20. The AD conversion method may be any of integrating conversion, sequential comparison conversion, and flash conversion. The AD conversion control circuit 30 controls the operation of the sample and hold circuit 20 and the AD converter 25. A result of AD conversion of the AD converter 25 is stored in a register provided in the AD conversion control circuit 30.

The switching unit 15 switches a signal as an object of AD conversion by switching an input signal of the sample and hold circuit 20. Concretely, the microcomputer chip 1 is provided with a plurality of terminals T0, T1, . . . receiving an analog input signal from the outside. The switching unit 15 includes switching elements SW0, SW1, . . . corresponding to the terminals T0, T1, . . . , respectively. Each of the terminals Ti (i=0, 1, . . . ) is coupled to the input node of the sample and hold circuit 20 via a corresponding switching element SWi. The on/off state of the switching elements SW0 and SW1 is switched by the AD conversion control circuit 30, there by switching an analog input signal as an object of AD conversion.

The switching unit 15 further includes a switching element SWR for switching the on/off state of coupling between the output node of the reference voltage generating circuit 7 and the input node of the sample and hold circuit 20. With the configuration, the AD converter 25 converts reference voltage Vref supplied via the switching element SWR to a digital value, thereby enabling the value of the reference voltage Vref to be detected.

The switching unit 15 further includes a switching element SWG for switching the on/off state of coupling between the input node of the sample and hold circuit 20 and the ground node GND. The voltage held in the sample and hold circuit 20 is discharged via the switching element SWG.

The reference voltage generating circuit 7 includes, for example, a band gap reference (BGR) circuit and generates the reference voltage Vref which does not depend on fluctuations in the external power supply voltage and fluctuations in the ambient temperature. The generated reference voltage Vref is distributed to an internal power supply circuit, an A/D converter, a comparison circuit, an oscillation circuit, and the like requiring high-precision reference voltage.

Problems of Conventional AD Converter

In a mass-production process of semiconductor circuits at present, at least two kinds of transistors are prepared. They are a high-voltage transistor (thick-film transistor) for an interface or an analog circuit and a low-voltage transistor (thin-film transistor) for a logic circuit. The low-voltage transistor has a thin gate oxide film and a low threshold voltage so that it can operate at power supply voltage lower than that for the high-voltage transistor.

A conventional reference voltage generating circuit is formed by high-voltage transistors. Consequently, even in the case of employing a use method of periodically monitoring the reference voltage value Vref by an AD converter while AD converting external input voltage, the reference voltage generating circuit is not destroyed.

With miniaturization and reduction in power consumption of a CMOS logic circuit in recent years, the power supply voltage of the CMOS logic circuit decreases close to 1V. Consequently, the reference voltage to be supplied to an internal power supply circuit has to be also decreased more than that in the conventional technique. Although a reference voltage generating circuit may not be formed by all of low-voltage transistors, at least a low-voltage transistor having a low threshold voltage has to be used as an output transistor which is coupled to an internal power supply circuit. Due to this, when an internal reference voltage is measured immediately after measurement of an external voltage of a relatively high voltage by an AD converter, there is the possibility that an output transistor of the reference voltage generating circuit is destroyed by the voltage held in the sample and hold circuit.

Consequently, prior to AD conversion of the internal reference voltage, the voltage held in the sample and hold circuit has to be discharged in advance. Concretely, in FIG. 1, in the case of AD converting analog voltage supplied from the terminal T0 by turning on the switching element SW0, the switching element SW0 is turned off and, after that, the switching element SWG is turned on. It discharges the voltage held in the sample and hold circuit 20. After that, the switching element SWG is turned off. Subsequently, by turning on the switching element SWR, AD conversion of the reference voltage Vref is started.

The turning on/off operations on the switching elements SW0, SWG, and SWR are realized by rewriting bits of a control register provided for the AD conversion control circuit 30 by a program. Consequently, when the user makes an error in generation of the program, the output transistor of the reference voltage generating circuit 7 is destroyed. There is another problem that it takes time to rewrite the bits of the control register.

The AD conversion control circuit 30 of the first embodiment is provided with a circuit (a switch control unit 40 in FIG. 2) for controlling the switching unit 15 so as to turn on the switching element SWG for predetermined time and, after that, turn on also the switching element SWR only by setting a bit for controlling the switching element SWR in the control register (accurately, setting of a start bit is also necessary). With the configuration, control can be performed reliably so that the output transistor of the reference voltage generating circuit 7 is not destroyed by the voltage held in the sample and hold circuit 20.

Configuration of AD Conversion Control Circuit

Figure 2:
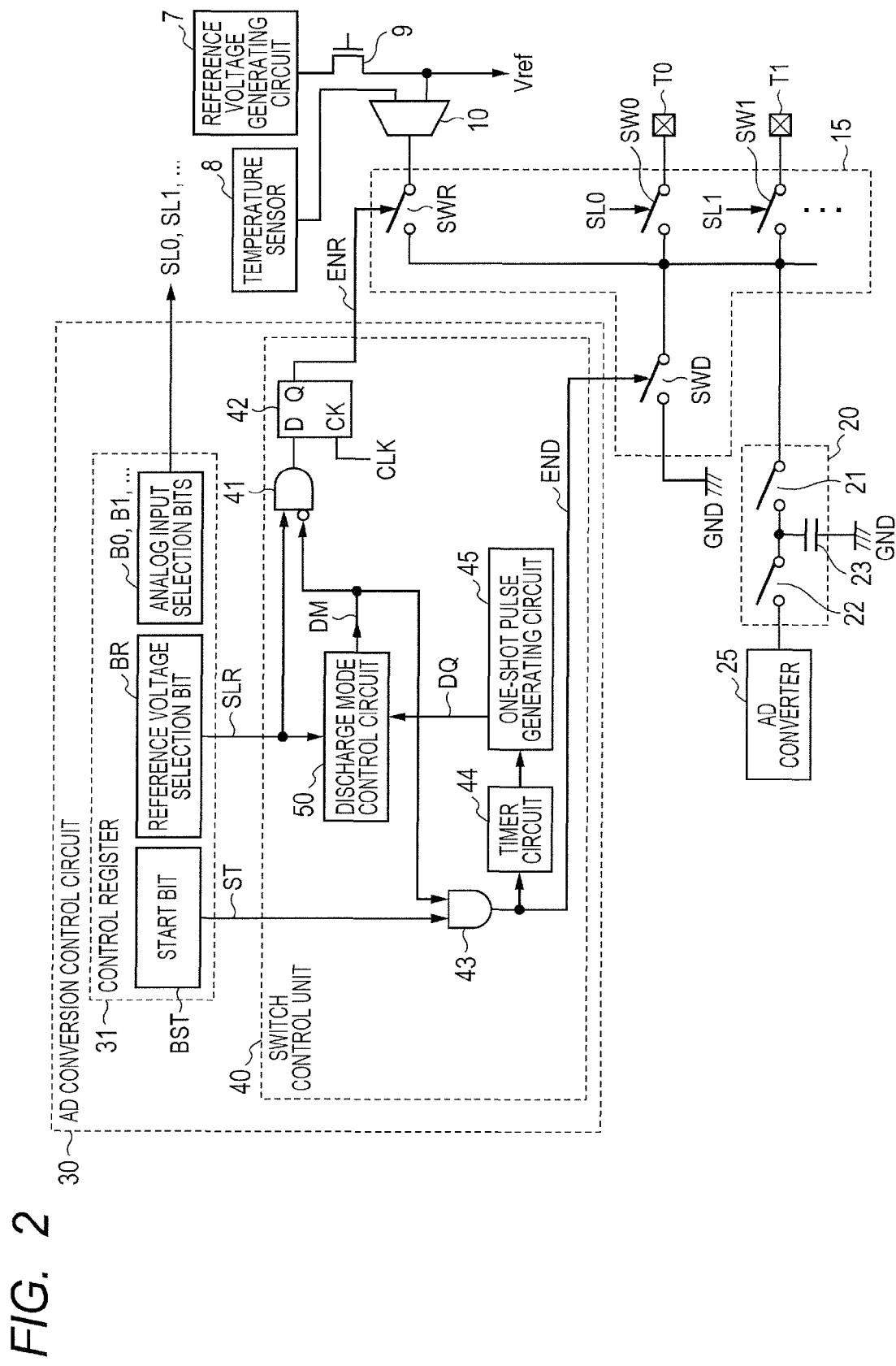
FIG. 2 is a block diagram illustrating the configuration of a part of an AD conversion control circuit in FIG. 1.

FIG. 2 is a block diagram illustrating the configuration of a part of the AD conversion control circuit in FIG. 1. In FIG. 2, particularly, the configuration related to control on the switching unit 15 in the AD conversion control circuit 30 in FIG. 1 is illustrated.

In FIG. 2, a temperature sensor circuit 8 for monitoring the temperature of the reference voltage generating circuit 7 is also illustrated. The temperature sensor circuit 8 includes, for example, a thermistor or a resistance temperature detector and outputs voltage which is generated in the thermistor or the resistance temperature detector when constant current is passed. Further, a selection circuit 10 for selecting one of the reference voltage Vref and the output voltage of the temperature sensor circuit 8 is provided. An output transistor 9 of the reference voltage generating circuit 7 and the selection circuit 10 are constructed by low-voltage transistors.

In FIG. 2, further, the sample and hold circuit 20 and the AD converter 25 related to the AD conversion control circuit 30 are illustrated. The sample and hold circuit 20 includes switching elements 21 and 22 and a capacitive element 23. At the time of sampling by turning on the switching element 21, the input voltage is held in the capacitive element 23. At the time of AD conversion, the switching element 21 enters an off state, and the switching element 22 enters an on state.

Hereinafter, referring to FIG. 2, the configuration for controlling the switching unit 15 will be described. The AD conversion control circuit 30 includes, as the configuration of its part, a control register 31 and a switch control unit 40.

The control register 31 has a start bit BST for starting AD conversion including discharging of the sample and hold circuit 20 and selection bits BR, B0, B1, . . . for selecting an object of AD conversion.

Concretely, in the case of FIG. 2, when "1" is set in the start bit BST, a start signal ST enters an active state (high level (H level)). The start signal ST is supplied to the switch control circuit 40. When "1" is set in the selection bit BR for selecting reference voltage as an object of AD conversion, a corresponding selection signal SLR enters an active state (H level). The selection signal SLR is supplied to the switch control circuit 40. When "1" is set in the selection bit Bi for selecting voltage supplied to a terminal Ti (i=0, 1, . . . ) as an object of AD conversion, a corresponding selection signal SLi enters an active state (H level). Each switching element SWi receives the selection signal SLi in the active state and is turned on.

The switch control unit 40 includes a discharge mode control circuit 50, logic gates 41 and 43, a D flip flop 42, a timer circuit 44, and a one-shot pulse generating circuit 45.

The discharge mode control circuit 50 receives the selection signal SLR (corresponding to the selection bit BR of reference voltage) and a discharge end pulse DQ and changes the logic level of the discharge mode signal DM in accordance with the signals. When the selection signal SLR changes to the active state (H level), the discharge mode control circuit 50 outputs a discharge mode signal DM in the active state (H level). The discharge mode signal DM is supplied to the logic gates 41 and 43.

The logic gate 41 performs AND computation between an inversion signal of the discharge mode signal DM and the selection signal SLR and outputs a computation result to the D flip flop 42. An output signal of the D flip flop 42 is supplied as an enable signal ENR to the switching element SWR. Therefore, when the selection signal SLR is in the active state (H level), the switching element SWR remains in the off state.

The logic gate 43 outputs, as the enable signal END, an AND result of the discharge mode signal DM and the start signal ST to the switching element SWD. Therefore, when the discharge mode signal DM is in the active state (H level) and the start signal ST is in the active state (H level), the switching element SWD enters the on state. By setting the switching element 21 of the sample and hold circuit 20 in the on state at this time, the voltage in the capacitive element 23 is discharged.

The timer circuit 44 starts counting when the enable signal END is changed to an active state (H level) (that is, when the switching element SWD enters the on state). After lapse of predetermined time since the counting is started, an output signal of the timer circuit 44 is switched to the active state (H level), on reception of the output signal of the timer circuit 44, the one-shot pulse generating circuit 45 outputs the discharge end pulse DQ.

The discharge mode control circuit 50 receives the discharge end pulse DQ and switches the discharge mode signal DM to the inactive state (L level). Accordingly, the enable signal END changes to the inactive state (L level), so that the switching element SWD is turned off. As a result, the discharge of the sample and hold circuit 20 is finished. Further, since the discharge mode signal DM changes to the inactive state (L level), the enable signal ENR changes to the active state (H level), so that the switching element SWR is turned on. Consequently, the output node of the reference voltage generating circuit 7 (or the temperature sensor circuit 8) and the input node of the sample and hold circuit 20 are coupled.

As described above, when "1" is set in the selection bit BR (that is, when the selection signal SBR becomes the active state (H level)) by the control operation of the switch control unit 40, by temporarily turning on the switching element SWD, the input node of the sample and hold circuit 20 and the ground node GND are coupled. After the switching element SWD returns to the off state, the switching unit 15 turns on the switching element SWR to thereby couple the input node of the sample and hold circuit and the output node of the reference voltage generating circuit 7 (or the temperature sensor circuit 8). As a result, the output transistor 9 of the reference voltage generating circuit 7 formed by the low voltage transistor can be reliably prevented from being destroyed.

Configuration of Discharge Mode Control Circuit

Figure 3:
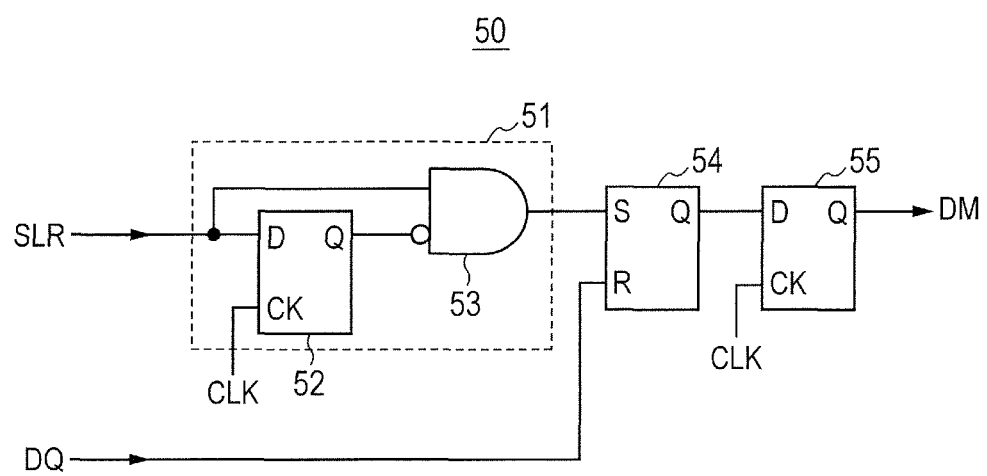
FIG. 3 is a circuit diagram illustrating the configuration of a discharge mode control circuit in FIG. 2.

FIG. 3 is a circuit diagram illustrating the configuration of a discharge mode control circuit in FIG. 2. Referring to FIG. 3, the discharge mode control circuit 50 includes a one-shot pulse generating circuit 51, an RS flip flop 54, and a D flip flop 55. The one-shot pulse generating circuit 51 includes a D flip flop 52 and a logic gate 53.

In the one-shot pulse generating circuit 51, the selection signal SLR (corresponding to the selection bit BR of the reference voltage) is supplied to a first input terminal of the logic gate 53 and also to the D flip flop 52. The logic gate 53 performs AND computation between a signal obtained by inverting the logic level of the output signal of the D flip flop 52 and the selection signal SLR and outputs a result of the computation. Therefore, when the selection signal SLR changes to the active state (H level), the one-shot pulse generating circuit 51 outputs an one-shot pulse at the high level for one cycle of the clock signal CLK.

To a set terminal (S) of the RS flip flop 54, the one-shot pulse output from the one-shot pulse generating circuit 51 is supplied. To a reset terminal (R), the discharge end pulse DQ is supplied. A set output of the RS flip flop 54 is held by the D flip flop 54 and is output as the discharge mode signal DM.

Therefore, the switching element SWG in FIG. 2 is switched to the on state in response to a result of the AND computation between the set output of the RS flip flop 54 and the start signal ST. When the switching element SWG enters the on state, the input node of the sample and hold circuit 20 and the ground node GND are coupled. The switching element SWR in FIG. 2 is switched to the on state in response to the result of AND computation between the reset output of the RS flip flop 54 and the selection signal SLR. When the switching element SWR enters the on state, the input node of the sample and hold circuit 20 and the output node of the reference voltage generating circuit 7 (or the temperature sensor circuit 8) are coupled to each other.

Operation of Switch Control Unit

Figure 4:
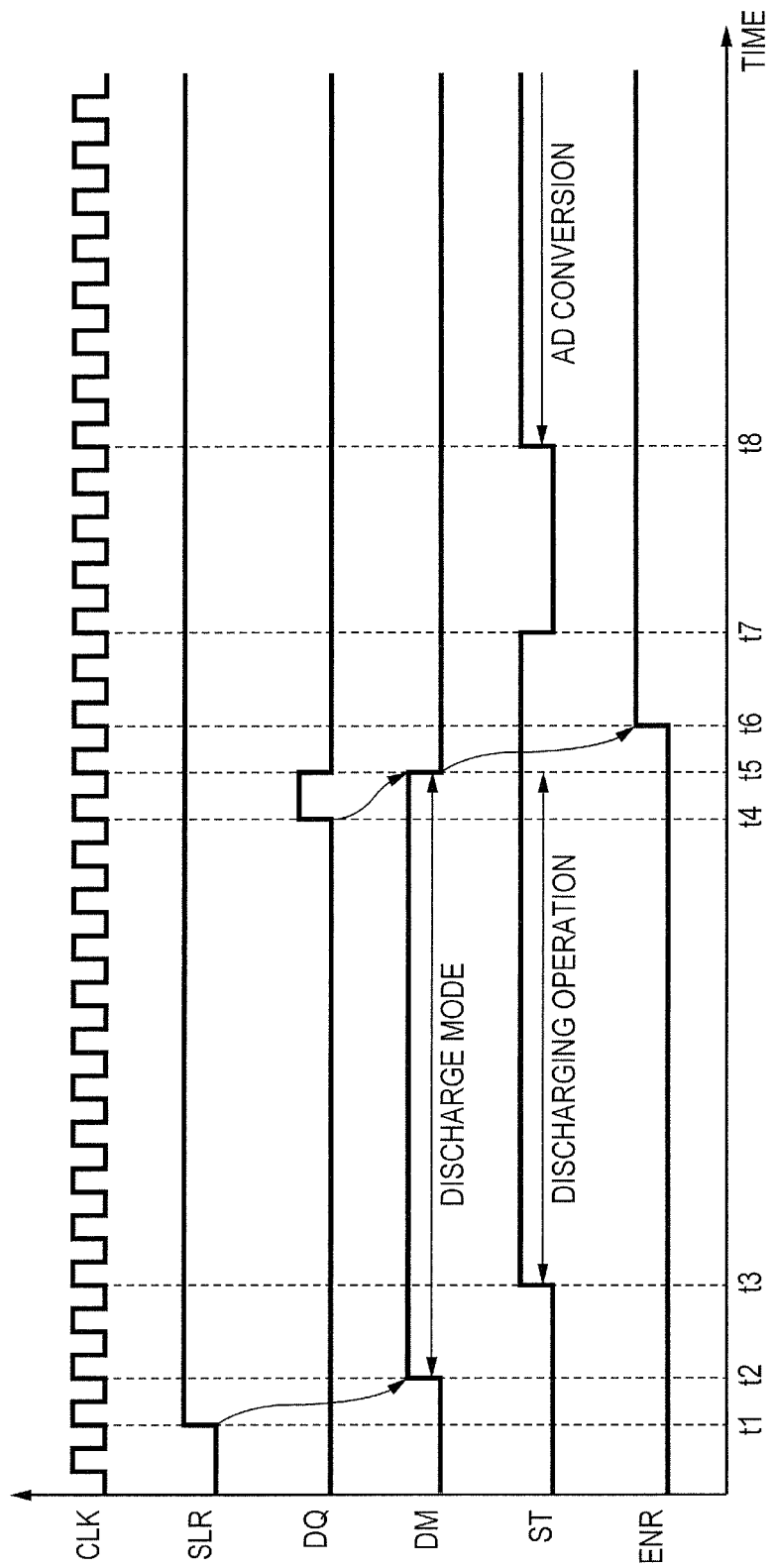
FIG. 4 is a timing chart illustrating signal waves in a switch control unit in FIG. 2.

FIG. 4 is a timing chart illustrating signal waves in the switch control unit in FIG. 2. FIG. 4 illustrates signal waves of, in order from top, a clock signal CLK, the selection signal SLR (corresponding to the selection bit BR selecting the reference voltage), the discharge end pulse DQ, the discharge mode signal DM, the start signal ST, and the enable signal ENR (corresponding to the switching element SWR). Hereinafter, with reference to FIGS. 2 to 4, the control operation of the switch control unit 40 will be described as a whole.

At time t1 in FIG. 4, "1" is set in the selection bit BR selecting the reference voltage, so that the selection signal SLR is switched to the active state (H level). In response to the change, at time t2, the discharge mode signal DM output from the discharge mode control circuit 50 changes to the active state (H level).

At the next time t3, "1" is set in the start bit BST, so that the start signal ST is switched to the active state (H level). Accordingly, the enable signal END is switched to the active state (H level), so that the switching element SWD is turned on. As a result, the discharge of the sample and hold circuit 20 is started.

At time t4 after lapse of predetermined time since the enable signal END is switched to the H level, the discharge end pulse DQ is supplied to the discharge mode control circuit 50. At the following time t5, the discharge mode signal DM changes to the inactive state (L level) (end of the discharge mode), so that the switching element SWD is turned off (end of the discharging operation). The discharge mode signal DM is switched to the inactive state (L level), so that the enable signal ENR is switched to the active state (H level) at the following time t6. As a result, the switching element SWR is turned on (that is, the input node of the sample and hold circuit 20 and the output node of the reference voltage generating circuit 7 (or the temperature sensor circuit 8) are coupled).

The start signal ST returns to the L level at time t7 after lapse of predetermined time since the level changes to the H level at time t3. At the following time t8, when the start signal ST switches to the active state (H level), the AD conversion starts.

Figure 5:
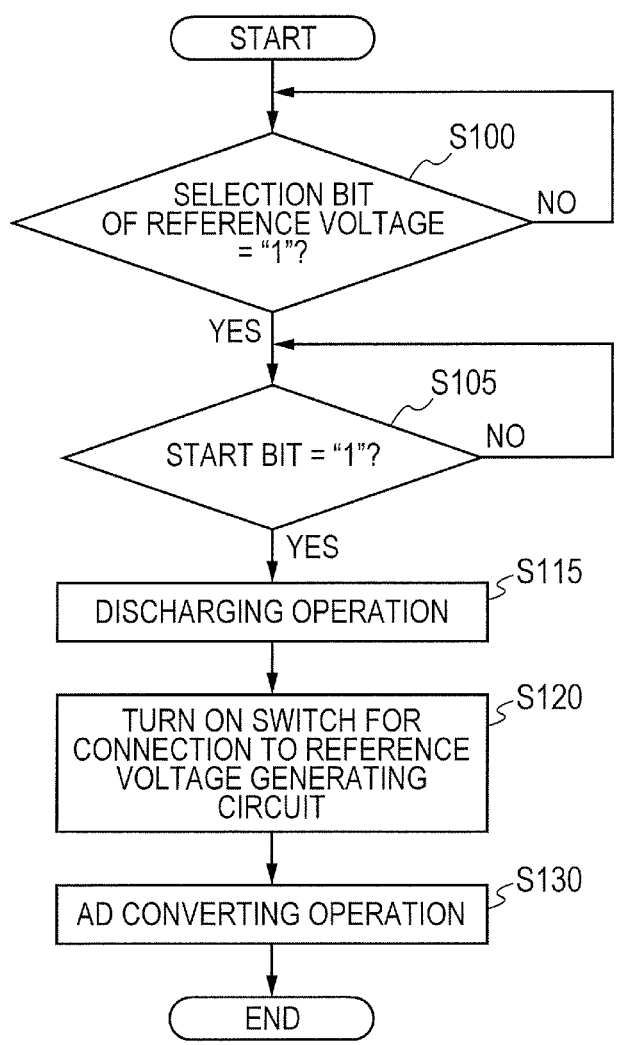
FIG. 5 is a flowchart illustrating the procedure of performing AD conversion of reference voltage by the AD conversion control circuit in FIG. 2.

FIG. 5 is a flowchart illustrating the procedure of performing AD conversion of reference voltage by the AD conversion control circuit in FIG. 2. With reference to FIGS. 2 and 5, when "1" is set in the selection bit BR for selecting the reference voltage as an object of AD conversion (YES in step S100) and "1" is set in the start bit BST (YES in step S105), the switch control unit 40 turns on the switching element SWD. Accordingly, the discharging operation of discharging the voltage held in the sample and hold circuit 20 starts (step S115).

After lapse of predetermined time since the switching element SWD is turned on, the switch control unit 40 turns off the switching element SWD and, then, turns on the switching element SWR. Accordingly, the input node of the sample and hold circuit 20 and the output node of the reference voltage generating circuit 7 (or the temperature sensor circuit 8) are coupled (step S120). After that, AD conversion starts (step S130).

Second Embodiment

In the conventional AD conversion control circuit, the user can selectively choose whether the discharge mode is set or not. Specifically, the voltage held in the sample and hold circuit can be discharged not only before execution of the AD conversion of the internal reference voltage or the temperature sensor circuit but also before execution of the AD conversion of analog voltage supplied from the outside. To an AD conversion control circuit of a second embodiment, a function of allowing the user to freely choose whether the voltage held in the sample and hold circuit is discharged or not is added. Hereinafter, it will be concretely described with reference to FIGS. 6 and 7.

Figure 6:
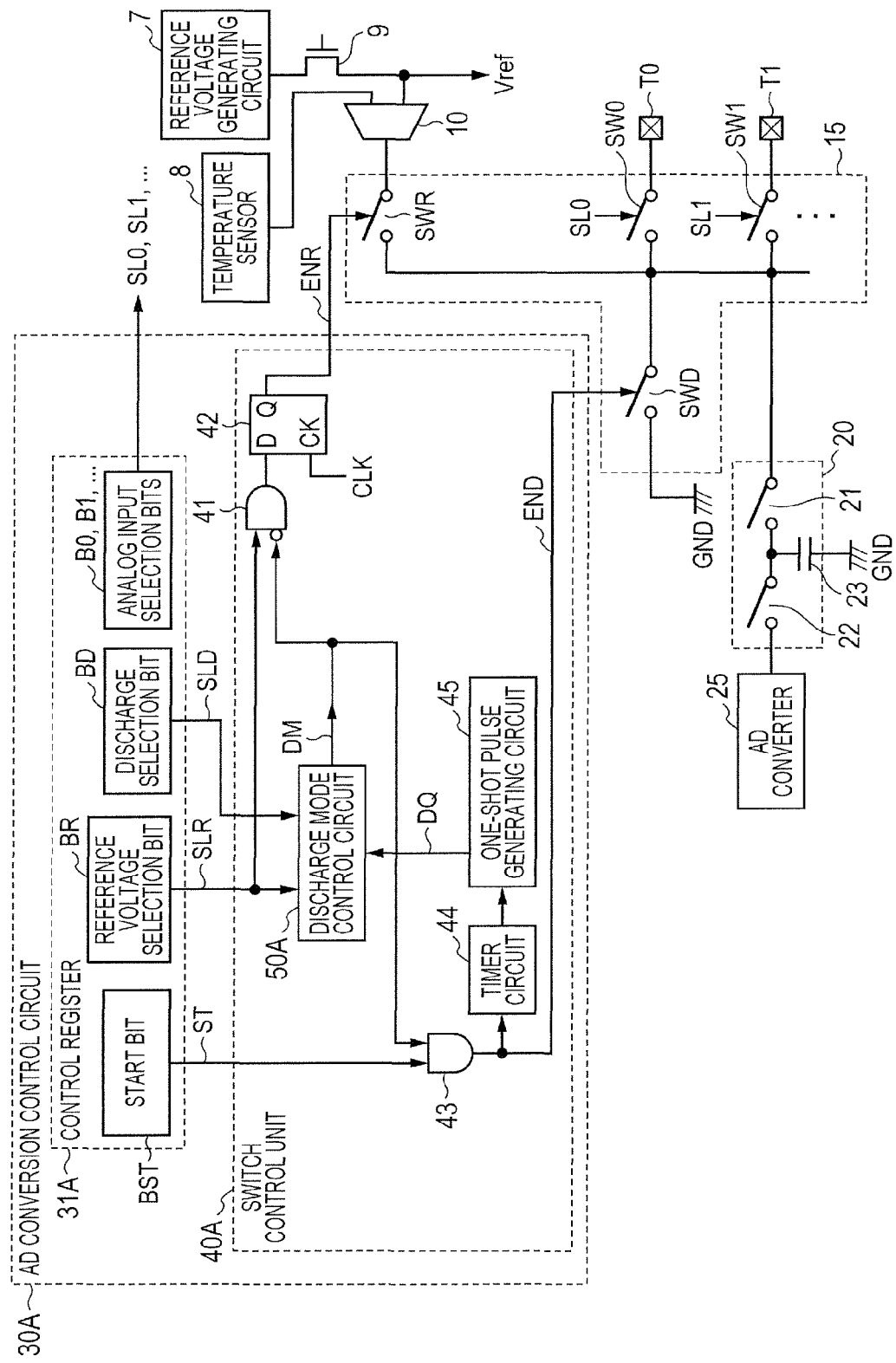
FIG. 6 is a block diagram illustrating the configuration of a part of an AD conversion control circuit as a second embodiment.
Figure 7:
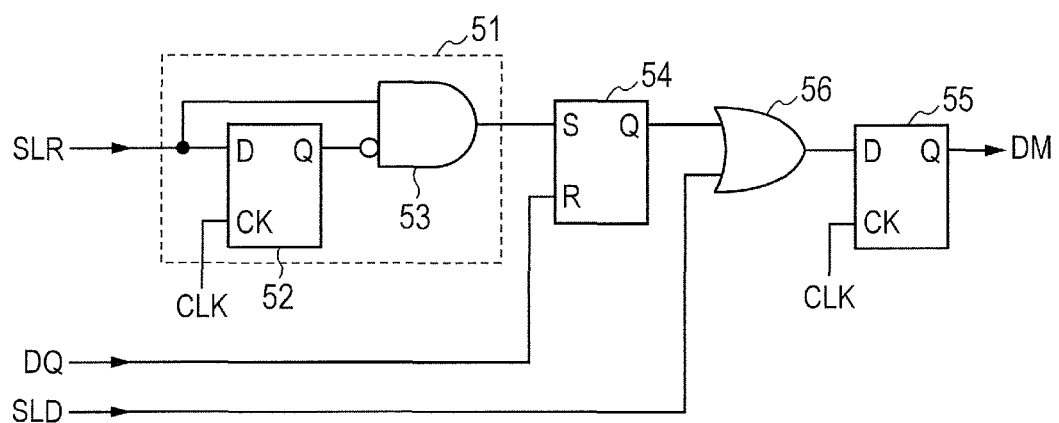
FIG. 7 is a circuit diagram illustrating the configuration of a discharge mode control circuit in FIG. 6.

FIG. 6 is a block diagram illustrating the configuration of a part of an AD conversion control circuit as the second embodiment. FIG. 7 is a circuit diagram illustrating the configuration of a discharge mode control circuit in FIG. 6.

An AD conversion control circuit 30A in FIG. 6 is different from the AD conversion control circuit 30 in FIG. 2 with respect to the point that a selection bit BD for selecting discharging of the sample and hold circuit 20 is further provided. When "1" is set in the selection bit BD, the selection signal SLD enters an active state (H level). The selection signal SLD is supplied to a discharge mode control circuit 50A.

The discharge mode control circuit 50A in FIG. 7 is different from the discharge mode control circuit 50 in FIG. 3 with respect to the point that an OR gate 56 provided between the RS flip flop 54 and the D flip flop 55 is further included. The OR gate 56 performs OR computation between the set output of the RS flip flop 54 and the selection signal SLD and supplies the computation result to the D flip flop 55. An output signal of the D flip flop 55 is supplied as the discharge mode signal DM to the logic gates 41 and 43 in FIG. 6.

With the above configuration, when "1" is set in the selection bit BD selecting the discharging operation (that is, the selection signal SLD and the discharge mode signal DM enter the active state (H level)) and "1" is set in the start bit BST, the switching element SWD is turned on, so that the voltage held in the sample and hold circuit 20 is discharged. After that, even if the discharge mode signal DM returns to the inactive state (L level), if "1" is not selected in the selection bit BR selecting the reference voltage, the switching element SWR is not turned on. Therefore, the user can select whether the discharging operation is performed or not regardless of execution of the AD conversion on the reference voltage (or the output signal of the temperature sensor circuit).

Third Embodiment

The AD conversion control circuit 30 of the first embodiment is configured to always discharge the voltage held in the sample and hold circuit before performing the AD conversion of the internal reference voltage or the output signal of the temperature sensor circuit. However, in the case where a voltage equal to or less than the withstand voltage of the low-voltage transistor is held in the sample and hold circuit, the low-voltage transistor is not destroyed even if the held voltage is not discharged. Consequently, an AD conversion control circuit 30B of a third embodiment has a configuration to determine whether or not voltage held in the sample and hold circuit is discharged depending on whether or not the voltage held in the sample and hold circuit (that is, the AD conversion result of last time) exceeds the withstand voltage of the low-voltage transistor. Hereinafter, it will be concretely described with reference to FIGS. 8 and 9. The third embodiment can be combined with the second embodiment.

Figure 8:
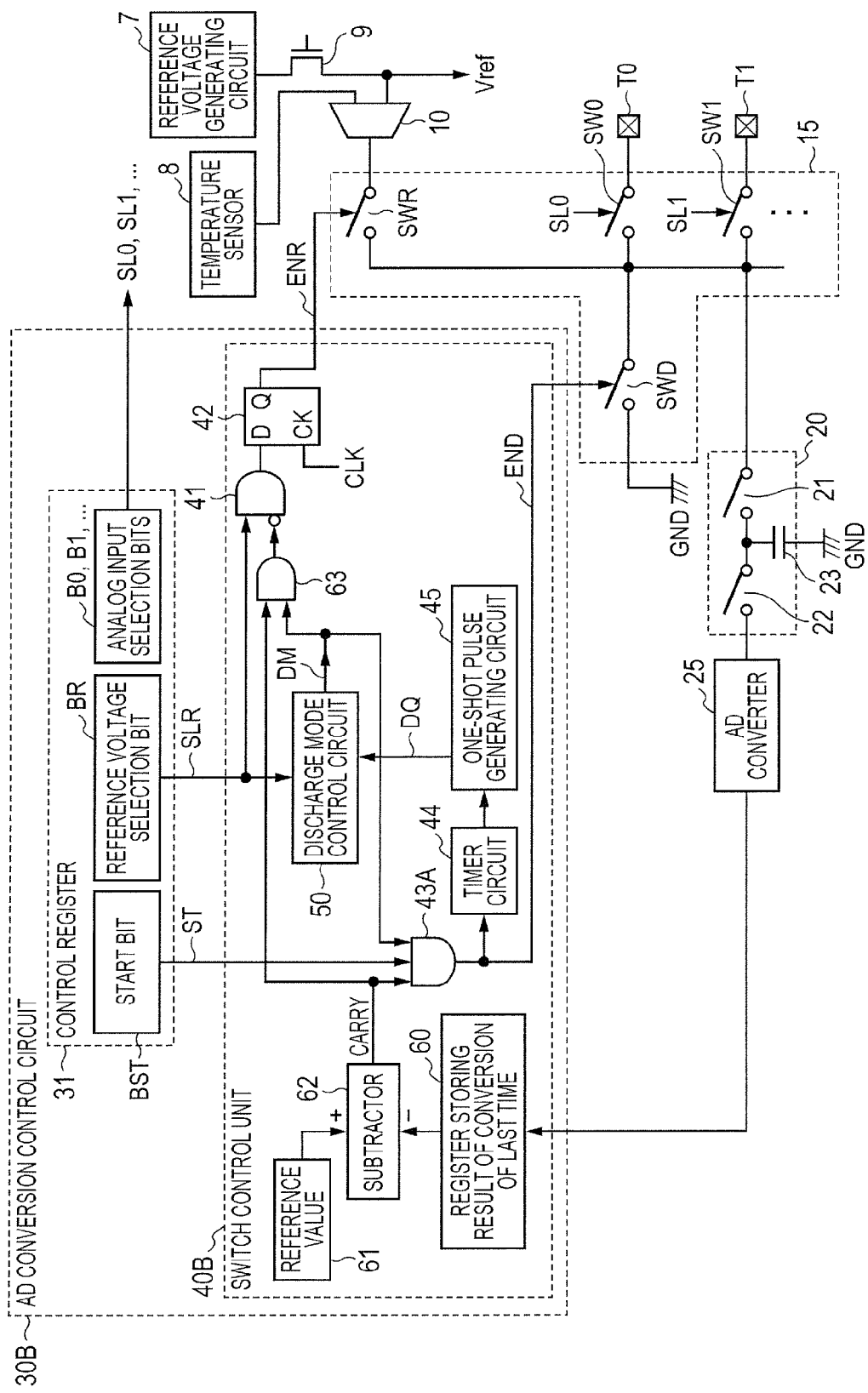
FIG. 8 is a block diagram illustrating the configuration of a part of an AD conversion control circuit as a third embodiment.

FIG. 8 is a block diagram illustrating the configuration of a part of an AD conversion control circuit as the third embodiment. A switch control unit 40B in the AD conversion control circuit 30B in FIG. 8 is different from the switch control unit 40 in FIG. 2 with respect to the point that a register 60 for storing an AD conversion result of last time, a register 61 holding a reference value corresponding to the withstand voltage of the low-voltage transistor, a subtracter 62, and an AND gate 63. Further, an AND gate 43A of the switch control unit 40B in FIG. 8 is different from the logic gate 43 in the switch control unit 40 in FIG. 2 with respect to the point it has three input terminals changed from the two input terminals.

Referring to FIG. 8, the subtracter 62 subtracts the AD conversion result of last time from a reference value corresponding to the withstand voltage of the low-voltage transistor. When the result of subtraction becomes a negative value, a carry flag becomes "1" (H level). The subtracter 62 outputs the carry flag to the AND gates 43A and 63.

The AND gate 43A outputs, as the enable signal END, a result of the AND computation of the discharge mode signal DM, the start signal ST, and the carry flag. Therefore, in the state where the carry flag is "1" (that is, when the AD conversion result of last time is larger than a reference voltage corresponding to the withstand voltage of the low-voltage transistor), when the discharge mode signal DM and the start signal ST become the active state (H level), the switching element SWD is turned on, and the discharging operation starts. On the other hand, when the carry flag is "0" (that is, when the AD conversion result of last time is equal to or less than a reference value corresponding to the withstand voltage of the low-voltage transistor), the enable signal END remains in the inactive state (L level), so that the voltage held in the sample and hold circuit is not discharged.

The AND gate 63 performs AND computation between the discharge mode signal DM and the carry flag. The logic gate 41 performs AND computation between a signal obtained by inverting the logic level of an output signal of the AND gate 63 (that is, a result of NAND computation of the discharge mode signal DM and the carry flag) and the selection signal SLR and outputs a result of the computation to the D flip flop 42. Therefore, when the carry flag is "1" (that is, when the AD conversion result of last time is larger than a reference value corresponding to the withstand voltage of the low-voltage transistor), the enable signal ENR switches to the active state (H level) in accordance with the logic level of the discharge mode signal DM. On the other hand, when the carry flag is "0" (that is, when the AD conversion result of last time is equal to or less than the reference value corresponding to the withstand voltage of the low-voltage transistor), the enable signal ENR switches to the active state (H level) when the selection signal SLR enters the active state (H level) regardless of the discharge mode signal DM. When the enable signal ENR is made active, the switching element SWR is turned on. As a result, the input node of the sample and hold circuit 20 and the output node of the reference voltage generating circuit 7 (or the temperature sensor circuit 8) are coupled to each other.

In place of the subtracter 62, an adder for adding a value taking the complement of two for the reference value corresponding to the withstand voltage of the low-voltage transistor and the AD conversion result of last time may be provided. In this case as well, when the AD conversion result of last time is larger than the reference value corresponding to the withstand voltage of the low-voltage transistor, the carry flag of the adder becomes "1".

Figure 9:
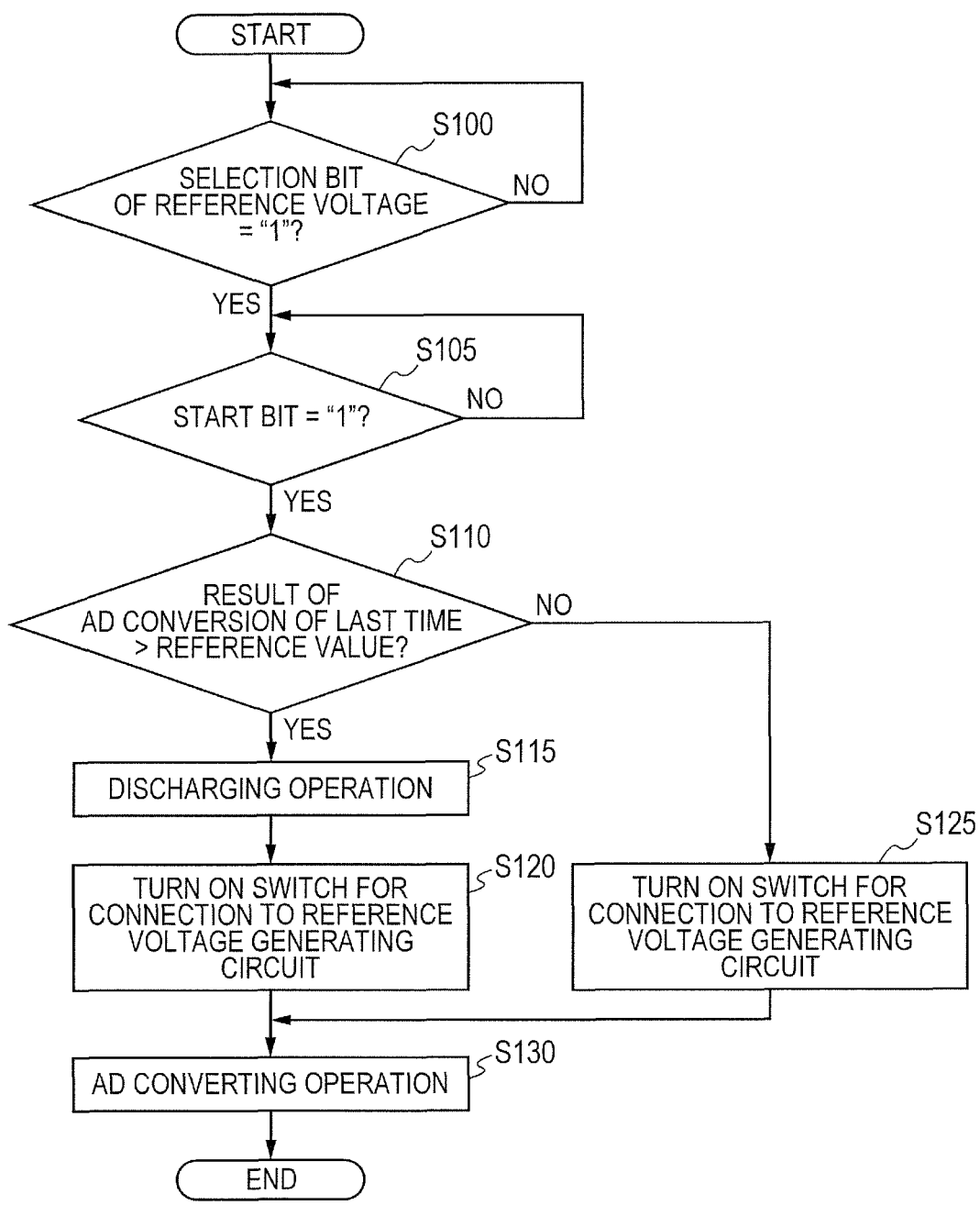
FIG. 9 is a flowchart illustrating the procedure of performing AD conversion of reference voltage by the AD conversion control circuit in FIG. 8.

FIG. 9 is a flowchart illustrating the procedure of performing AD conversion of reference voltage by the AD conversion control circuit in FIG. 8.

With reference to FIGS. 8 and 9, first, "1" is set in the selection bit BR for selecting the reference voltage as an object of AD conversion (YES in step S100) and "1" is set in the start bit BST (YES in step S105). In this state, when the carry flag of the subtracter 62 is "1", that is, when the AD conversion result of last time is larger than the reference voltage corresponding to the withstand voltage of the low-voltage transistor (YES in step S110), the switch control unit 40B turns on the switching element SWD. Accordingly, the discharging operation of discharging the voltage held in the sample and hold circuit 20 starts (step S115).

After lapse of predetermined time since the switching element SWD is turned on, the switch control unit 40B turns off the switching element SWD and, then, turns on the switching element SWR. Accordingly, the input node of the sample and hold circuit 20 and the output node of the reference voltage generating circuit 7 (or the temperature sensor circuit 8) are coupled (step S120). After that, AD conversion starts (step S130).

On the other hand, when the carry flag of the subtracter 62 is "0", that is, when the AD conversion result of last time is equal to or less than the reference value corresponding to the withstand voltage of the low-voltage transistor (NO in step S110), the switch control unit 40B turns on the switching element SWR while the switching element SWD is left in the off state. Accordingly, the input node of the sample and hold circuit 20 and the output node of the reference voltage generating circuit 7 (or the temperature sensor circuit 8) are coupled (step S125). After that, the AD conversion is started (step S130).

Although the invention achieved by the inventors herein has been concretely described on the basis of the embodiments, obviously, the invention is not limited to the foregoing embodiments but can be variously modified without departing from the gist of the invention.

What is claimed is:

1. A semiconductor device comprising:
   a sample and hold circuit;
   an AD converter for AD (Analog-to-Digital) converting an output of the sample and hold circuit;
   a signal terminal for receiving an analog signal;
   a reference voltage generating circuit for generating and outputting a reference voltage;
   a first switch electrically coupling the signal terminal to the input node of the sample and hold circuit,
   a second switch electrically coupling the ground node to the input node of the sample and hold circuit, and
   a third switch electrically coupling the output node of the reference voltage generating circuit to the input node of the sample and hold circuit; and
   a switch control unit for controlling the first to third switch, the switch control unit generating a first control signal (END) for turning on the second switch and generating, based on the first control signal, a second control signal (DQ) for turning on the third switch.

2. The semiconductor device according to claim 1, wherein the switch control unit turns off the second switch based on the second control signal.

3. The semiconductor device according to claim 1,
   wherein when receiving an instruction of detecting the reference voltage in the case where a result of AD conversion of last time by the AD converter is equal to or less than a reference value, the switch control unit turns on the third switch without turning on the second switch after receiving the instruction, and
   wherein when receiving the instruction in the case where a result of AD conversion of last time by the AD converter exceeds the reference value, the switch control unit turns on the third switch after turning on the second switch after receiving the instruction.

4. The semiconductor device according to claim 1,
   wherein the switch control unit comprises:
   a first pulse generating circuit for outputting a one-shot pulse when a third control signal (SLR) instructing a detecting of the reference voltage is activated;
   a second pulse generating circuit for outputting a one-shot pulse after lapse of predetermined time since the second switch turns on; and
   an RS (Reset-Set) flip flop for receiving the one-shot pulse which is output from the first pulse generating circuit by a set terminal and receiving the one-shot pulse which is output from the second pulse generating circuit by a reset terminal,
   wherein the second switch turns on in response to a set output of the RS flip flop, and
   wherein the third switch turns on in response to a reset output of the RS flip flop and the third control signal.

5. The semiconductor device according to claim 2,
   wherein the switch control unit comprises:
   a first pulse generating circuit for outputting a one-shot pulse when a third control signal (SLR) instructing a detecting of the reference voltage is activated;
   a second pulse generating circuit for outputting a one-shot pulse after lapse of predetermined time since second switch turns on; and
   an RS (Reset-Set) flip flop for receiving the one-shot pulse which is output from the first pulse generating circuit by a set terminal and receiving the one-shot pulse which is output from the second pulse generating circuit by a reset terminal, wherein the second switch turns on in response to a set output of the RS flip flop and a fourth control signal (SLD) instructing a discharge of the sample and hold circuit, and wherein the third switch turns on in response to a reset output of the RS flip flop and the third control signal.

6. The semiconductor device according to claim 3, wherein the switch control unit comprises:

a first pulse generating circuit for outputting a one-shot pulse when a third control signal (SLR) instructing a detecting of the reference voltage is activated;

a second pulse generating circuit for outputting a one-shot pulse after lapse of predetermined time since second switch turns on;

an RS (Reset-Set) flip flop for receiving the one-shot pulse which is output from the first pulse generating circuit by a set terminal and receiving the one-shot pulse which is output from the second pulse generating circuit by a reset terminal; and a subtracter for subtracting a result of AD conversion of last time by the AD converter from a predetermined reference value and outputting a carry flag indicating whether a result of the subtraction becomes a negative value or not, wherein the second switch turns on in response to a set output of the RS flip flop and the carry flag, and wherein the third switch turns on in response to a set output of the RS flip flop, the carry flag and the third control signal.

7. The semiconductor device according to claim 1, further comprising a transistor having a predetermined gate oxide film thickness;

wherein the reference voltage generating circuit including an output transistor having a gate oxide film thickness thinner than the predetermined gate oxide film thickness.

8. A semiconductor device comprising:

a sample and hold circuit;

an AD converter for AD (Analog-to-Digital) converting an output of the sample and hold circuit;

a signal terminal for receiving an analog signal;

a reference voltage generating circuit for generating and outputting a reference voltage;

a first switch electrically coupling the signal terminal to the input node of the sample and hold circuit, a second switch electrically coupling the ground node to the input node of the sample and hold circuit, and a third switch electrically coupling the output node of the reference voltage generating circuit to the input node of the sample and hold circuit; and a switch control unit for controlling the first to third switch, the switch control unit controlling so as to turn on the third switch and turn off the second switch after turning on the second switch.

9. The semiconductor device according to claim 1, wherein the switch control unit generates the second control signal (DQ) a predetermined time period after generating the first control signal.

* * * * *